US012635110B2

(12) United States Patent
Shaw et al.

(10) Patent No.: US 12,635,110 B2
(45) Date of Patent: May 19, 2026

(54) DUAL INLINE MEMORY MODULE HEAT SINK FOR CONDUCTION COOLED ENVIRONMENTS

(71) Applicant: Crystal Group, Inc., Hiawatha, IA (US)

(72) Inventors: James E Shaw, Ely, IA (US); Robert Johnson, North Liberty, IA (US)

(73) Assignee: Crystal Group, Inc., Hiawatha, IA (US)

( * ) Notice: Subject to any disclaimer, the term of this patent is extended or adjusted under 35 U.S.C. 154(b) by 252 days.

(21) Appl. No.: 17/368,562

(22) Filed: Jul. 6, 2021

(65) Prior Publication Data

US 2022/0007541 A1     Jan. 6, 2022

Related U.S. Application Data

(60) Provisional application No. 63/048,625, filed on Jul. 6, 2020.

(51) Int. Cl.
| | |
|---|---|
| *H05K 7/20* | (2006.01) |
| *F28D 15/02* | (2006.01) |
| *F28D 15/04* | (2006.01) |

(52) U.S. Cl.
CPC ..... *H05K 7/20336* (2013.01); *F28D 15/0233* (2013.01); *F28D 15/046* (2013.01); *H05K 7/20509* (2013.01)

(58) Field of Classification Search
CPC ............. H05K 1/0204; H05K 7/20336; H05K 7/20509; F28D 15/0233; F28D 15/046
See application file for complete search history.

(56) References Cited

U.S. PATENT DOCUMENTS

| | | |
|---|---|---|
| 7,400,505 B2 | 7/2008 | Campbell et al. |
| 7,408,776 B1 | 8/2008 | Campbell et al. |
| 7,420,808 B2 | 9/2008 | Campbell et al. |

(Continued)

*Primary Examiner* — Jacob R Crum
(74) *Attorney, Agent, or Firm* — Simmons Perrine PLC

(57) ABSTRACT

A system and method enabling the use of convection cooled dual-inline memory modules (DIMM) in non-convection environments, specifically used for computing applications for harsh environments. This system and method describes a design which transfers heat from the various components on the memory module to thermally opportunistic areas of an enclosure in the absence of sufficient or in some cases any convective cooling conditions. The system and method describes a sandwiched metal heat plate assembly, being constructed from a thermally conductive material, which is attached to a heat pipe, designed to be highly thermally conductive, which is further attached to a thermally conductive cold plate saddle, which in turn is connected to a thermal sink. The heat generated in the DIMM is conducted to the heat plate by way of a thermal interface material, this energy transferred to the heat pipe, and then to a cold plate which dissipates the energy to the ambient environment. The system does not require a plurality of fins inside the enclosure, liquid cooling, nor airflow within the enclosure to accomplish the memory thermal management. The invention includes a heat pipe saddle, a heat pipe, a clamshell heat extraction mechanism in conjunction with a thermal interface compound for improving the heat transfer from the DIMM to the heat sink.

2 Claims, 7 Drawing Sheets

(56) References Cited

U.S. PATENT DOCUMENTS

| | | | |
|---|---|---|---|
| 7,450,385 B1 | 11/2008 | Campbell et al. | |
| 7,474,529 B2 | 1/2009 | Tian et al. | |
| 7,518,871 B2 | 4/2009 | Campbell et al. | |
| 7,641,101 B2 | 1/2010 | Campbell et al. | |
| 7,715,197 B2 | 5/2010 | Tian et al. | |
| 7,751,918 B2 | 7/2010 | Campbell et al. | |
| 8,570,744 B2 | 10/2013 | Rau et al. | |
| 8,625,280 B2 | 1/2014 | Rau et al. | |
| 8,767,403 B2 | 7/2014 | Rau et al. | |
| 9,606,590 B2 | 3/2017 | Walker et al. | |
| 9,841,791 B2 | 12/2017 | Mullen et al. | |
| 10,085,358 B2 | 9/2018 | Adiletta et al. | |
| 10,262,920 B1 * | 4/2019 | Refai-Ahmed | H01L 23/4275 |
| 10,595,439 B2 | 3/2020 | Shia et al. | |
| 2004/0080908 A1 * | 4/2004 | Wang | G06F 1/203 |
| | | | 174/15.2 |
| 2006/0250772 A1 * | 11/2006 | Salmonson | G06F 1/20 |
| | | | 361/698 |
| 2008/0291630 A1 * | 11/2008 | Monh | F28D 15/0266 |
| | | | 361/700 |
| 2009/0168356 A1 * | 7/2009 | Chen | H01L 23/427 |
| | | | 361/709 |
| 2010/0025010 A1 * | 2/2010 | Cipolla | H01L 23/4093 |
| | | | 165/47 |
| 2011/0286175 A1 * | 11/2011 | Iyengar | G06F 1/20 |
| | | | 361/679.47 |
| 2013/0074339 A1 * | 3/2013 | Boraas | H01L 23/3737 |
| | | | 29/726 |
| 2016/0349809 A1 * | 12/2016 | Kinstle, III | H01L 23/34 |

* cited by examiner

DUAL INLINE MEMORY MODULE HEAT SINK FOR CONDUCTION COOLED ENVIRONMENTS

CROSS REFERENCE TO RELATED APPLICATIONS

This application claims the benefit of the filing date of the provisional patent application having Ser. No. 63/048,625 filed Jul. 6, 2020, the contents of which is incorporated herein in its entirety by this reference.

FIELD OF THE INVENTION

The present invention relates to computers and more particularly, dual inline memory modules (DIMMs) and systems and methods for cooling the same.

BACKGROUND OF THE INVENTION

Server class computer platforms were typically not employed in environments that are harsh, such as military vehicles, construction vehicles, weapons platforms, space launch systems, etc. However, these server platforms are becoming more necessary because of the need for virtualization and compute density in smaller spaces. One of several obstacles requiring resolution is the need to enclose the computer platform while simultaneously reducing moving parts, such as cooling fans and pumps on these computer platforms. In more normal computer platforms, DIMMS are often cooled by convention with fans moving air between the DIMMS or pumping coolant to the heat producing memory chips.

While DIMMs have been successfully cooled in various ways, in demanding environments it has been increasingly an area of concern for particular applications.

Consequently, there exists a need for improved methods and systems for cooling DIMMs in a computer platform used in harsh environments, such as military vehicles, weapons platforms, and space launch systems, all done in a reliable and cost efficient manner.

SUMMARY OF THE INVENTION

It is an object of the present invention to provide a system and method for cooling DIMMs in an efficient manner.

It is a feature of the present invention to utilize non-moving parts to cool DIMMS.

It is an advantage of the present invention to reduce occasions of failure owing to use of moving parts to move air or coolant to and away from memory chips in DIMMS.

It is another feature of the present invention to include clam like heat exchange structure about the memory chips on a DIMM.

It is another feature of the present invention to use a heat pipe to transfer heat from the memory chips to distant thermally opportunistic areas in an enclosed computer platform.

It is another advantage to provide a memory chip cooling system which has highly reliable methods to transfer heat from the memory chips to discrete areas inside an enclosed computer platform.

The present invention is an apparatus and method for cooling DIMMs so as to satisfy the aforementioned needs, provide the previously stated objects, include the above-listed features, and achieve the already articulated advantages. The present invention is carried out in a "memory chip cooling failure-less" manner in a sense that the failures associated with memory chip cooling fans and pumps have been eliminated.

Accordingly, the present invention is a system memory chips in DIMMS during operation in harsh environments and demanding applications comprising:

An apparatus for cooling memory modules comprising:
a cold plate saddle;
a heat pipe;
a cover plate; and
a back plate; where an assembly is mechanically created by using a brazing process to attach the back plate, heat pipe, and saddle, while the cover plate and the back plate are each thermally coupled to a memory module using a thermal interface compound.

Accordingly, the present invention is a method comprising the steps of:

providing a parallel plurality of adjacent dual in-line memory module (DIMM) connectors, each having a connector longitudinal axis, being disposed on a motherboard with an interstitial gap therebetween;

providing a parallel plurality of adjacent DIMMs each having a memory chip thereon and a memory module top edge and a memory module longitudinal axis;

providing a parallel plurality of adjacent DIMM receiving heat sinks each of which is disposed over at least portions of each memory chip on each of said parallel plurality of adjacent DIMMs;

transferring heat with a two phase heat transfer device which receives heat from said at least one of said parallel plurality of adjacent DIMM receiving heat sinks, which is configured to transfer heat away from said at least one of said parallel plurality of adjacent DIMM receiving heat sinks; and providing a cold plate configured to receive heat from said two phase heat transfer device.

BRIEF DESCRIPTION OF THE DRAWINGS

The invention may be more fully understood by reading the following description of the preferred embodiments of the invention, in conjunction with the appended drawings wherein.

DETAILED DESCRIPTION

Though this description details are given of a motherboard, DIMM and a DIMM connector, it should be understood that different circuit cards with different types of electronic components could be used with different connector sizes and configurations. It is intended that these specific details not limit the scope of the present invention, unless repeated in the claims, but instead fully enable a specific and/or best mode of the invention and other variations of this card and connector types are intended to be readily understood from the following description and included within the scope and spirit of the present invention.

Figure 1:
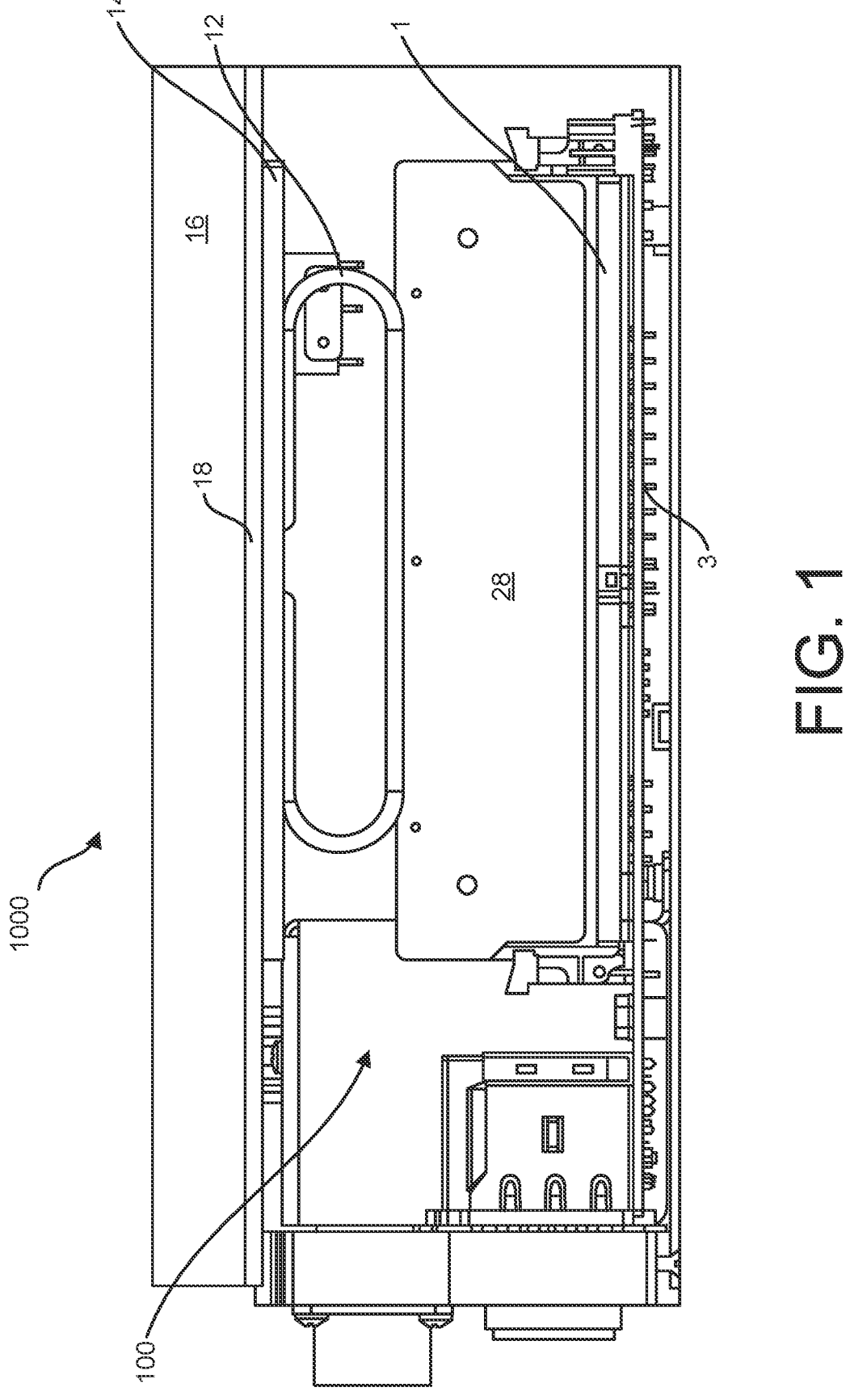
FIG. 1 is a cross-sectional view of the present invention in its intended environment.

Now referring to the drawings wherein like numerals refer to like matter throughout, and more specifically referring to FIG. 1, there is shown a DIMM cooling system 100, of the present invention which is inside an enclosed high density computer platform 1000. The system 100 includes a DIMM 1 or other secondary circuit board in a perpendicular orientation, with a mother board 3. Mounted on motherboard 3 could be a group of parallel DIMM connectors with parallel gaps therebetween.

The screw on heat transfer cover 28 is shown disposed over the memory chips (not shown) on the DIMM 1. The heat pipe 12 is shown disposed between and thermally coupling the cover 28 and the saddle 14, which is thermally coupled to the heat sink 16 which may be a single object with a cold plate 18 flat base with perpendicular cooling fins 19 (FIG. 3).

Figure 2:
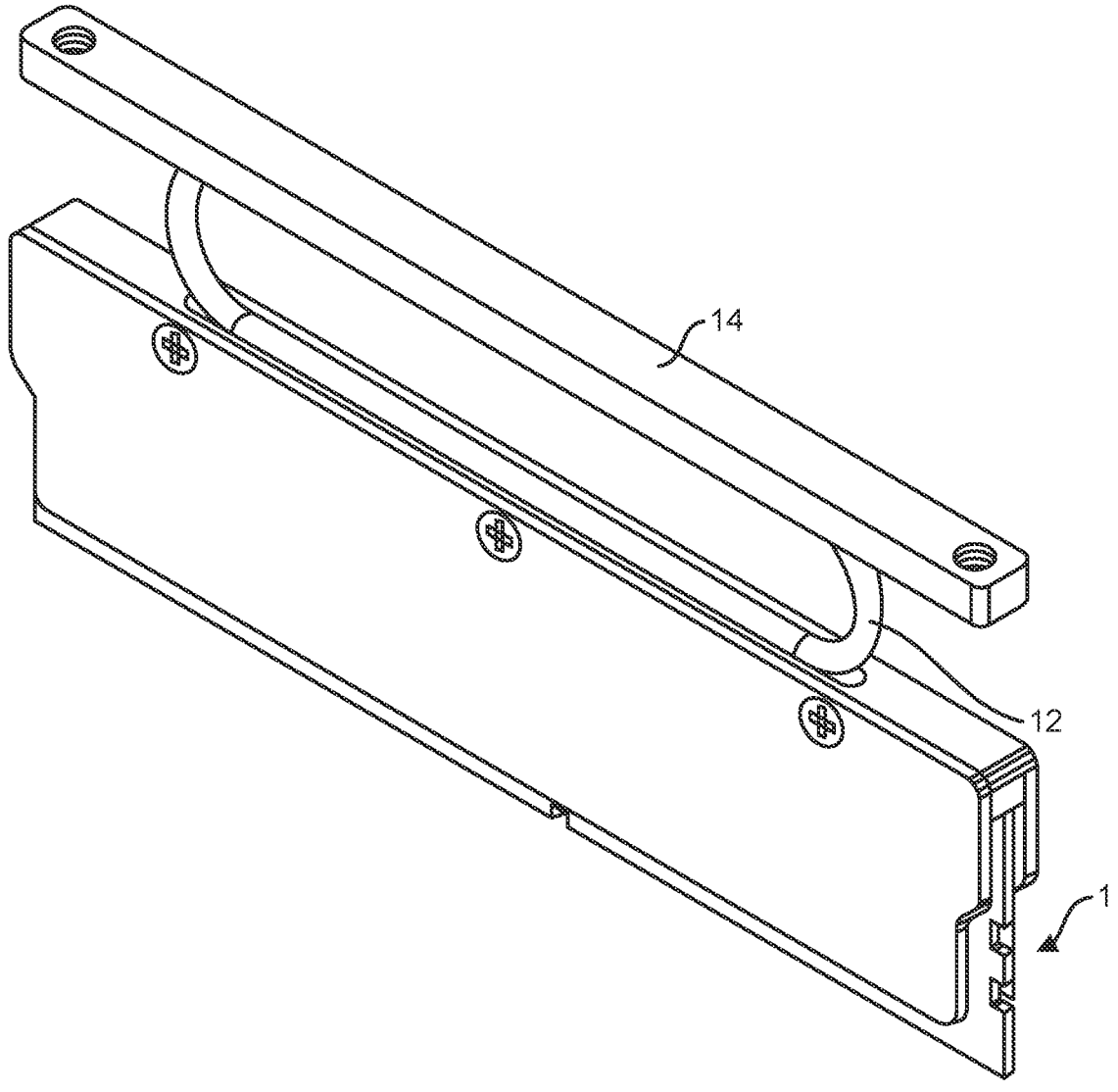
FIG. 2 is a perspective view of a DIMM of the prior art, partially disposed within the present invention.

Now referring to FIG. 2, there is shown a perspective view of the present invention.

Figure 3:
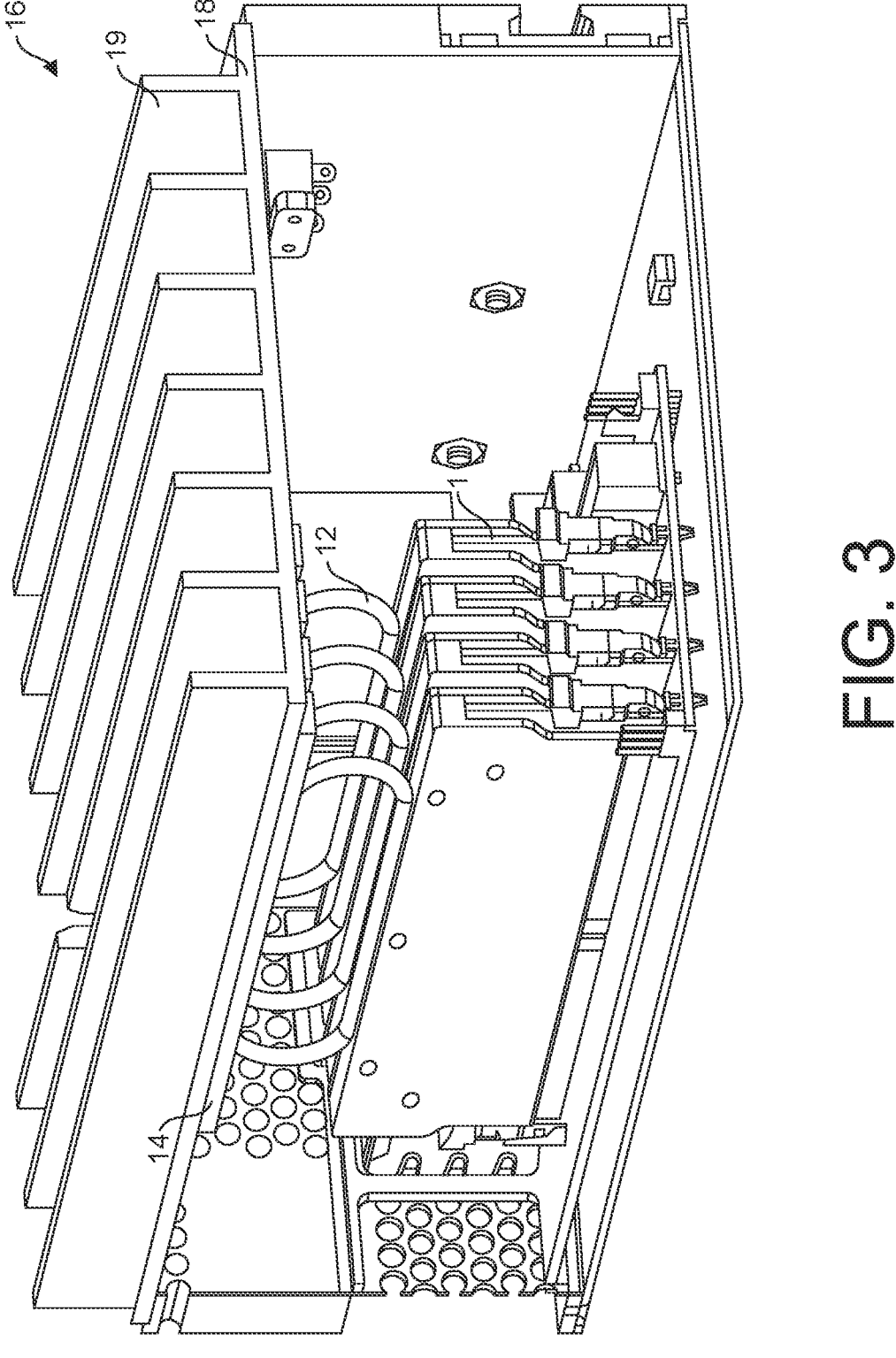
FIG. 3 is a cut-away view of the present invention shown inside of an enclosed computer platform.

Now referring to FIG. 3, there is shown a cut-away view of the computer platform 1000 of FIG. 1 where the system 100 is shown disposed in a clamshell construction with heat pipes 12 thermally coupling the heat producing memory chips to the heat sink 16 without the use of any moving matter, except for the movement of liquid and vapor within the heat pipes 12.

Figure 4:
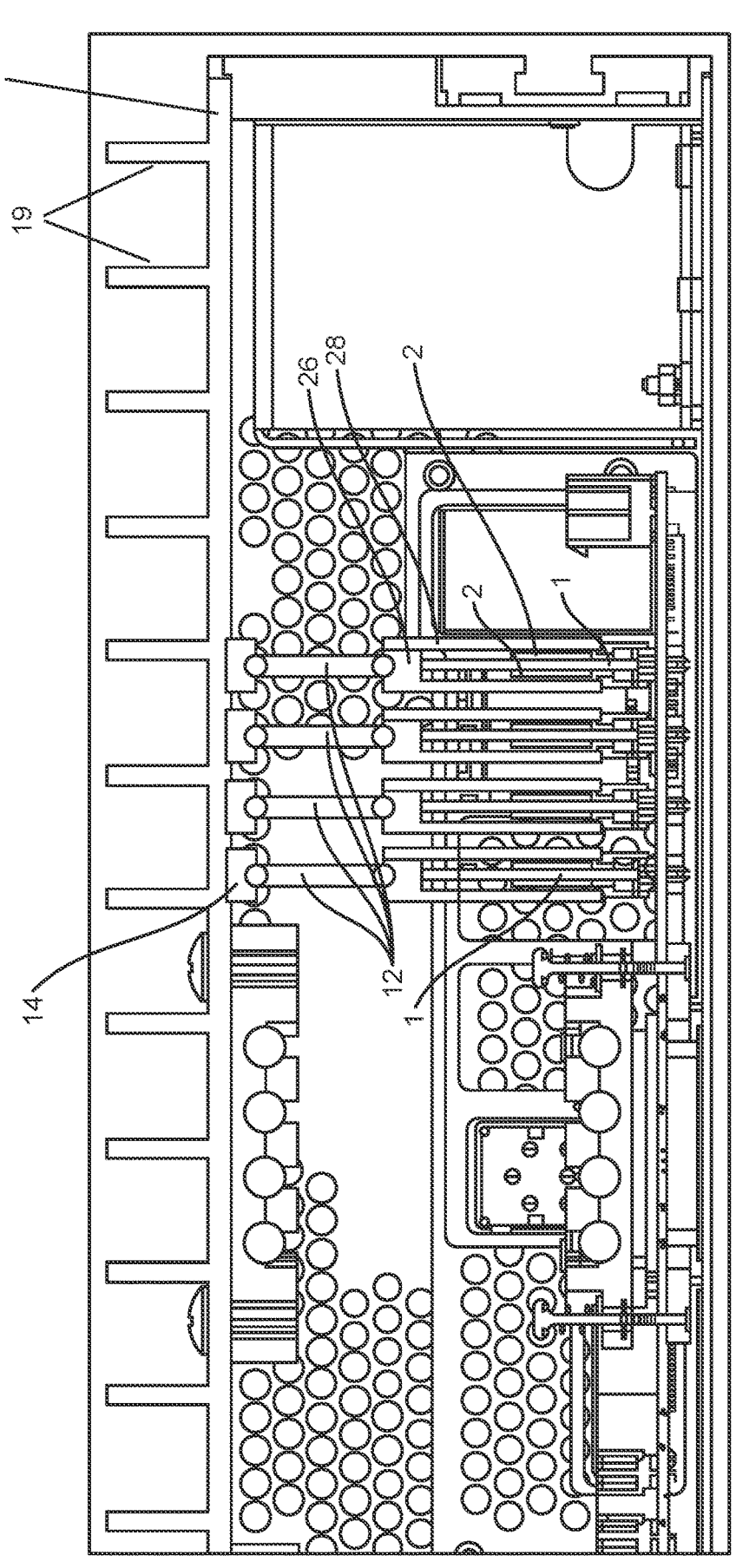
FIG. 4 is a cross-sectional view of system of FIG. 3 showing a view along the longitudinal axes of the DIMMs.

Now referring to FIG. 4, there is shown a cross-sectional view of the computer platform 1100 with the system 100 therein. The view is taken on a line which is parallel with the longitudinal axes of the DIMMs 1 shown therein, with memory chips 2 thereon.

Figures 5, 6:
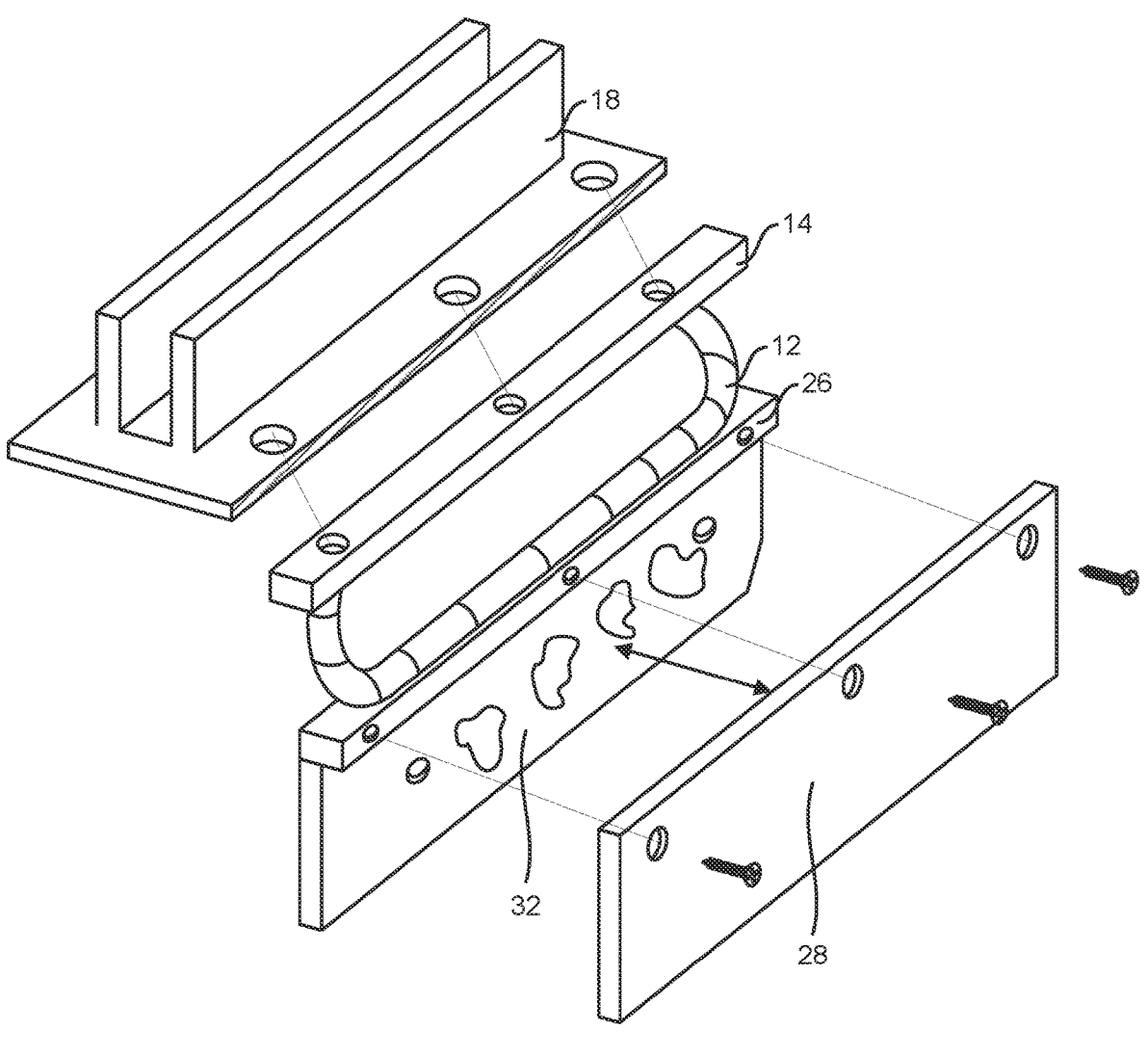
FIG. 5 is an exploded perspective view of the present invention.
FIG. 6 is cross-sectional view of a portion of the system shown in FIG. 5.

Now referring to FIG. 5, there is shown an exploded perspective view of the system 100 for cooling DIMMs. The cold plate 18 is shown with integral cooling fins 19 thereon and heat pipe connecting screw holes 517 therethrough for coupling with, screws to the holes 515 in the heat pipe 12, which is shown coupled to the rear heat plate 28 which has a plurality of locations thereon with thermally conductive matter, such as grease, paste, or putty which are preferable in registration with or in contact with the heat producing memory chips on the DIMM (not shown). The front cover 28 is shown with holes and screws for connection to the rear plate 26. When the DIMM (not shown) has memory chips on both sides, the front cover 28 would have similar locations of thermally conductive matter in registration and/or in contact with the memory chips (not shown) thereon.

Now referring to FIG. 6, there is shown a cross-sectional view of the heat pipe 12 and the saddle 14 and interface to a top portion of the rear plate 26.

Figure 7:
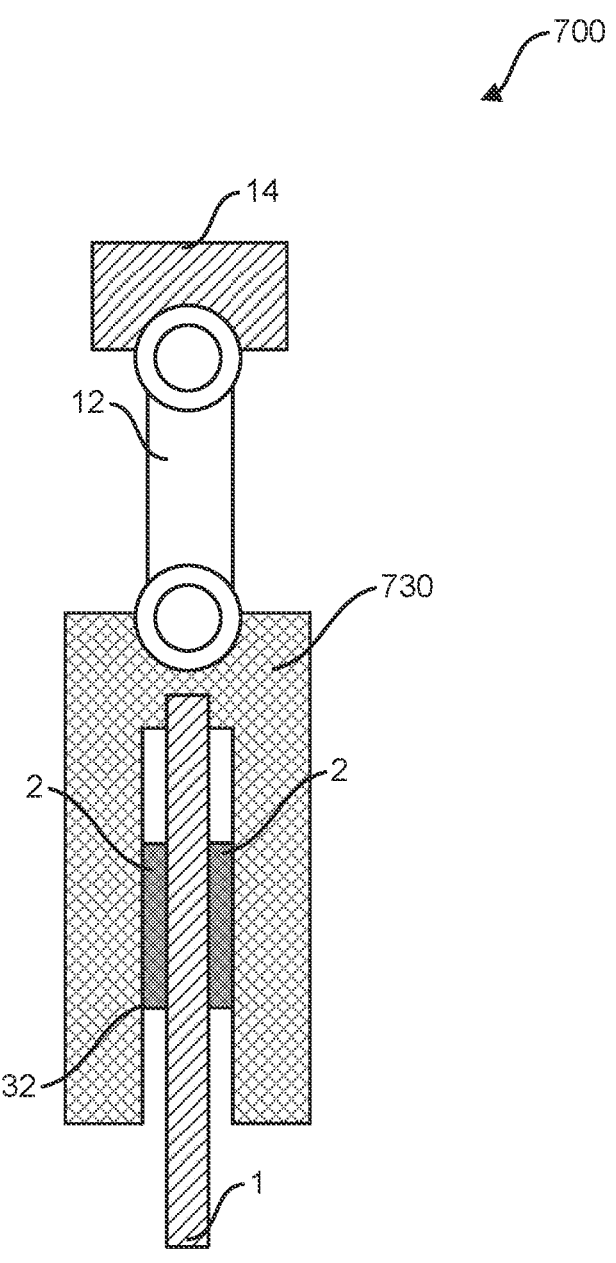
FIG. 7 is cross-sectional view of an alternate embodiment of the present invention.

Now referring to FIG. 7, there is shown a cross-sectional view of an alternate embodiment of the present invention which has the rear plate 26 and the front cover 28 replaced with a single machined U-shaped heat sink 730 with a saddle for heat pipe 12 and room for thermally conductive material 32 to be place between the memory chips 2 on DIMM 1.

Figure 8:
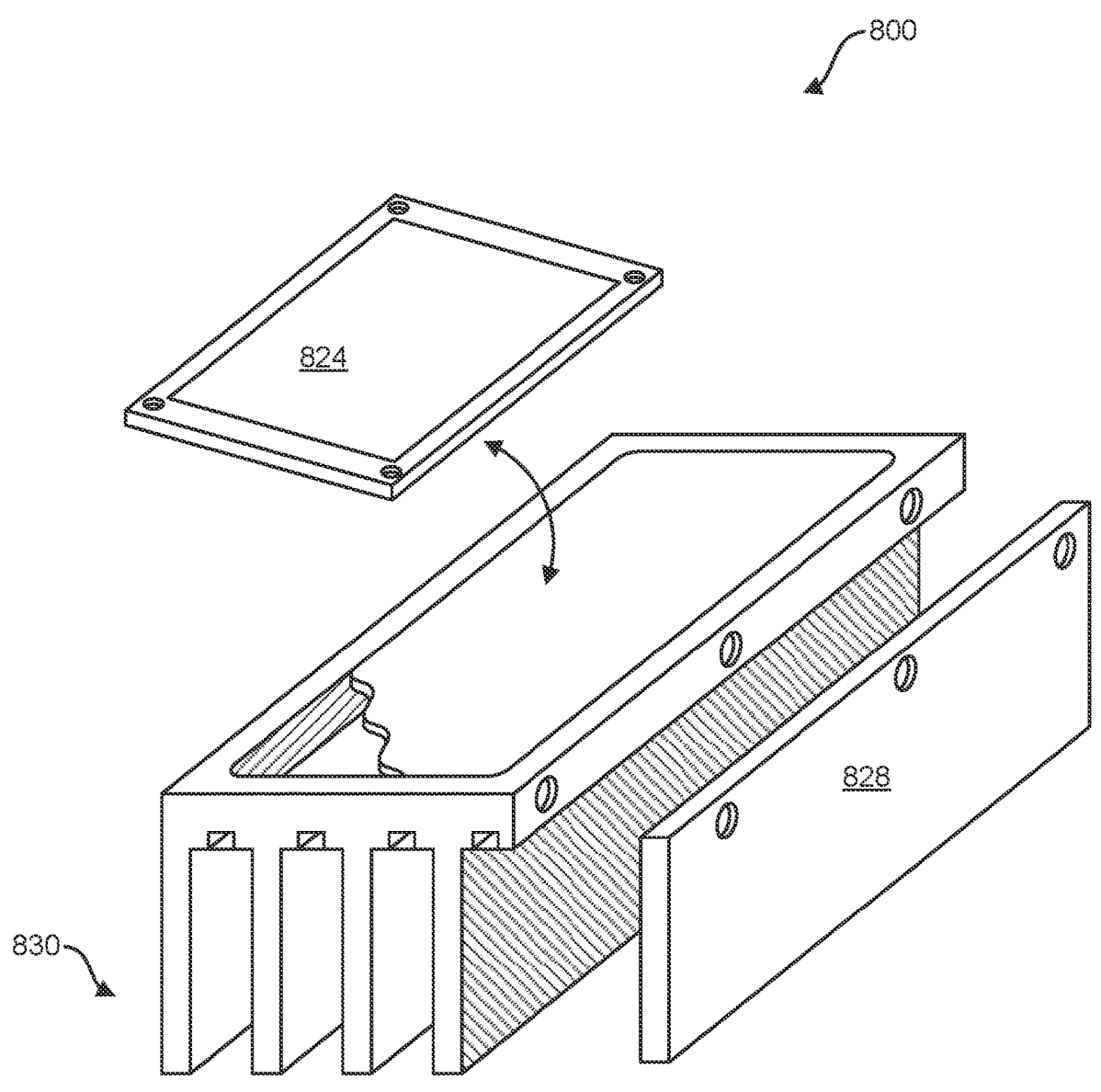
FIG. 8 is an exploded perspective view of yet another alternate embodiment of the present invention.

Now referring to FIG. 8, there is shown a multi-DIMM receiving heat sink 830 with room for receiving four DIMMs therein (when cover 828 is attached). When vapor chamber lid 824, which may be a brazed lid, is disposed on an opening at the top of multi-DIMM receiving heat sink 830, the vapor chamber thereby formed will allow for a sharing of any excess heat associated with one DIMM to be spread out over the cold plate above the four DIMMs. This can reduce the likelihood of one DIMM failing (e.g. by temporary high activity of one memory chip) when the other DIMMs in the multi-DIMM receiving heat sink 830 are not overheated.

It is thought that the method and apparatus of the present invention will be understood from the foregoing description and that it will be apparent that various changes may be made in the form, construct steps, and arrangement of the parts and steps thereof, without departing from the spirit and scope of the invention or sacrificing all of their material advantages. The form herein described is merely a preferred exemplary embodiment thereof.

We claim:

1. An apparatus for cooling memory modules comprising:
a saddle;
a heat pipe;
a cover plate;
a back plate;
a thermal interface material disposed between and physically and thermally coupling said cover plate to a memory module;
said thermal interface material also disposed between and physically and thermally coupling said back plate to said memory module;
wherein said heat pipe is brazed to said saddle and said back plate to form an integral assembly;
wherein said cover plate is removably attached to said back plate to allow for installation and removal of said memory module;
said back plate having a plurality of threaded screw engaging holes therein;
said cover plate having a plurality of screw passage permitting holes therethrough;
a plurality of screws extending through said passage holes in the cover plate and engaging said threaded holes in the back plate;
where the back plate and the cover plate are, in combination, constructed to accept multiple DIMM cards as an assembly thereby allowing for the installation of a plurality of DIMMs into a single heat sink assembly with the heat pipe attached to a single saddle piece for attachment to a cold plate.

2. An apparatus for cooling memory modules comprising:
a saddle;
a heat pipe;
a cover plate;
a back plate;
a thermal interface material disposed between and physically and thermally coupling said cover plate to a memory module;
said thermal interface material also disposed between and physically and thermally coupling said back plate to said memory module;
wherein the heat pipe is brazed to the saddle and the back plate to form an integral assembly,
wherein the cover plate is removably attached to the back plate to allow for installation and removal of the memory module; where the heat pipe is a vapor chamber and the saddle is modified to accept said vapor chamber;
where the back plate and the cover plate are, in combination, constructed to accept multiple DIMM cards as an assembly thereby allowing for the installation of a plurality of DIMMs into a single heat sink assembly with the heat pipe attached to a single saddle piece for attachment to a cold plate; wherein:

said back plate having a plurality of threaded screw engaging holes therein;

said cover plate having a plurality of screw passage permitting holes therethrough; and a plurality of screws each of which is configured to be disposed in one of said plurality of threaded screw engaging holes and one of said plurality of screw passage permitting holes;

whereby the cover plate and back plate assembly applies a compressive force to the memory module when the screws are tightened, securing the memory module within the heat sink assembly.

* * * * *